(12) United States Patent
Caveney

(10) Patent No.: US 6,769,861 B2
(45) Date of Patent: Aug. 3, 2004

(54) APPARATUS FOR ALIGNMENT AND ORIENTATION OF A WAFER FOR PROCESSING

(75) Inventor: Robert T. Caveney, Windham, NH (US)

(73) Assignee: Brooks Automation Inc., Chelmsford, MA (US)

( * ) Notice: Subject to any disclaimer, the term of this patent is extended or adjusted under 35 U.S.C. 154(b) by 0 days.

(21) Appl. No.: 10/267,465

(22) Filed: Oct. 8, 2002

(65) Prior Publication Data

US 2004/0067128 A1 Apr. 8, 2004

(51) Int. Cl.[7] ............................................. B65G 49/07
(52) U.S. Cl. .................... 414/783; 294/103.1; 414/936; 414/941
(58) Field of Search ................................ 414/433, 783, 414/936, 941; 294/103.1

(56) References Cited

U.S. PATENT DOCUMENTS

| | | | |
|---|---|---|---|
| 5,647,724 A | 7/1997 | Davis, Jr. et al. | 414/744.5 |
| 5,810,935 A * | 9/1998 | Lee et al. | 118/728 |
| 5,851,041 A * | 12/1998 | Anderson et al. | 294/106 |
| 5,882,413 A | 3/1999 | Beaulieu et al. | 118/719 |
| 6,256,555 B1 * | 7/2001 | Bacchi et al. | 700/245 |
| 6,468,022 B1 * | 10/2002 | Whitcomb | 414/757 |
| 6,540,468 B1 * | 4/2003 | Blattner et al. | 414/416.08 |
| 6,652,216 B1 * | 11/2003 | Astegno et al. | 414/416.03 |
| 6,682,113 B2 * | 1/2004 | Cox et al. | 294/104 |
| 2002/0064450 A1 * | 5/2002 | Coomer et al. | 414/939 |
| 2002/0192056 A1 * | 12/2002 | Reimer et al. | 414/217 |

* cited by examiner

Primary Examiner—Janice L. Krizek
(74) Attorney, Agent, or Firm—Perman & Green, LLP; Richard Pickreign

(57) ABSTRACT

The effector of a robot is constructed with positioning pads at its distal end. The pads provide an accurate registration surface for engagement of the substrate. A pair of idler rollers, which slide along the longitudinal axis of the effector, is moved by an actuator into engagement with the substrate and the assembly urges the substrate against the positioning pads. A pair of wheels is mounted on a platform independent of the effector with one of the wheels driven by a motor. An optical sensor mounted with the wheels detects an orientation mark on the edge of the substrate and allows the driven wheel to rotate the substrate to its specified angular position.

10 Claims, 3 Drawing Sheets

APPARATUS FOR ALIGNMENT AND ORIENTATION OF A WAFER FOR PROCESSING

FIELD OF THE INVENTION

This invention relates to the alignment and orientation of substrates on a robot which is part of a semiconductor processing system.

BACKGROUND OF THE INVENTION

The processing of semiconductors often involves multiple process steps such as the deposit of a film on a substrate or substrate by chemical vapor deposition (CVD), the photo etching of the film, as well as heating, cooling and cleaning.

Each of the process operations is generally performed under vacuum in a specialized process chamber. Depending on the nature of each process, either batch processing of semiconductor substrates or individual substrate processing is used. In either of the above systems, for each process step, the process chamber must be vented, the substrate loaded, the chamber sealed and pumped to vacuum. After processing, the steps are reversed.

In batch processing, a cluster of processing chambers are arranged around a substrate transport chamber which is constructed to be kept under vacuum. One or more load lock chambers are connected through slit valves to the transport chamber.

The load locks accommodate cassettes of substrates to be processed. The cassettes are delivered to the load lock by the front end delivery transport of the system. A load lock constructed to accommodate such cassettes is shown in U.S. Pat. No. 5,664,925 owned in common with the subject application. The disclosure of the '925 patent is incorporated herein by reference, in its entirety.

In batch processing cycling times are reduced, while significantly increasing system throughput. The process and transport chambers are maintained continuously under vacuum, while only the load lock is cycled. The load lock receives the substrates to be processed after being sealed from the transport chamber and vented to atmosphere. The front end port is than sealed and the load lock is pumped to a vacuum consistent with the transport and processing chambers.

A robotic transfer mechanism is mounted within the transport chamber and operates to remove substrates from the load lock and deliver them to the selected process chambers. After processing, the substrates are picked up by the robot and transported to the next process chamber or to a load lock for removal from the transport chamber. In some instances, for timing purposes, these systems may employ buffer stations which are adapted to store substrates either before loading or at other times during the transport of the substrate through the system.

A system of this type is described in U.S. Pat. No. 5,882,413 and an example of a robotic transfer mechanism is shown in U.S. Pat. No. 5,647,724, each of which is assigned to an owner common to this application. The disclosures of these patents are incorporated herein by reference in their entirety.

It has been found that substrates up to 200 mm in diameter can be effectively processed with the cluster type systems. However, there is a trend towards increasing diameters and the cluster systems become unduly large when processing substrates of 300 mm or more in diameter. In some circumstances, there is a need to provide a more compact process handling module, which is capable of being installed in a side by side relation within a small envelope of space. In addition there is a need for system modules which are more adaptable to the wide variety of process chambers and front end delivery transports. A system of this type is described in commonly owned Application for patent Ser. No. 09/897,202 filed Jul. 2, 2001.

In all of the above systems there are requirements for accurate alignment of the substrate on the robot arm of the transport mechanism. This insures that the process is applied in a controllable distribution over the substrate surface. In addition there is a need to orient the substrate in a consistent angular position to insure that each substrate is processed in the same pattern. The orientation step consists of locating an orientation mark, which is generally a notch placed at a predetermined location on the edge of the substrate. The overall registration of the substrate on the robot arm needs to be accomplished at some point accessible to the normal trajectory of the substrate prior to its insertion into a processing chamber.

It is a purpose of this invention to provide a mechanism for accurate and consistent alignment and edge orientation of a substrate on the robot arm.

One of the current solutions to accomplishing this registration function is to provide a separate station for aligning and orienting the substrate prior to placement of the substrate on the robot arm. This complicates the processing path of the substrate with a potential delay in the overall processing cycle time. Another prior art mechanism is constructed at the distal end of the effector. In this system a driven roller is mounted on the distal end with an associated drive motor to rotate the substrate to its desired orientation. This creates a thick profile at the end effector which may obstruct the entrance of the substrate into some process chambers. In addition this weighs down the end effector and makes it cumbersome. Another mechanism is mounted on the robot drive base for engagement by the robot arm. In this configuration, the alignment/orientation mechanism must be moved out of the way of the robot arm prior to movement to a processing chamber.

It is a purpose of this invention to provide alignment of a substrate on a robot arm by mechanically centering the substrate on fixed tip pads and providing a separate orientation module against which the substrate is banked by motion of the effector. This eliminates the need for additional mass on the effector.

SUMMARY OF THE INVENTION

The mechanism of this invention consist of an effector constructed with a pair of fixed positioning pads at the its distal end. At the back end of the effector, a pair of idler rollers are mounted for sliding motion along the central longitudinal axis of the effector. The idler rollers are moved by means of a vacuum actuator, into engagement with the inner edge of the substrate and push the substrate into engagement with the positioning pads of the effector. The vacuum actuator has sufficient spring action built in to bias the substrate outward. An edge orientation module is positioned independently and is constructed with a pair of wheels one of which is driven. The substrate is moved into engagement with the wheels in a way that lifts the edge of the substrate free of the positioning pads. The lifting frees the substrate for rotation on the inner idler rollers and the wheels of the orientation module. A simple optical sensor is positioned between the wheels to locate the orientation notch. Once the center of the notch is located, the substrate can be rotated to its specified angular orientation. The lift action may be obtained by the z axis of the robot or by providing a z axis motion for the orientation module.

In an alternate embodiment, the orientation module is mounted on a lower arm of the robot in a position which allows engagement of the substrate edge by movement of the effector. In this instance, it may be advantageous to provide a z axis motion of the orientation module to lift the substrate for rotation. The z axis motion can also be accomplished by mounting the orientation module to the grounded base drive of the robot arm drive and using the z axis supplied as part of the robot drive to allow relative motion between the end effector and the orientation module.

DESCRIPTION OF THE DRAWING

The invention is described in more detail below with reference to the attached drawing in which.

DESCRIPTION OF THE PREFERRED EMBODIMENT

Throughout this application the term substrate will be used to refer to planar substrates such as silicon substrates and flat glass panels. This term is meant in its broadest sense.

Figure 1:
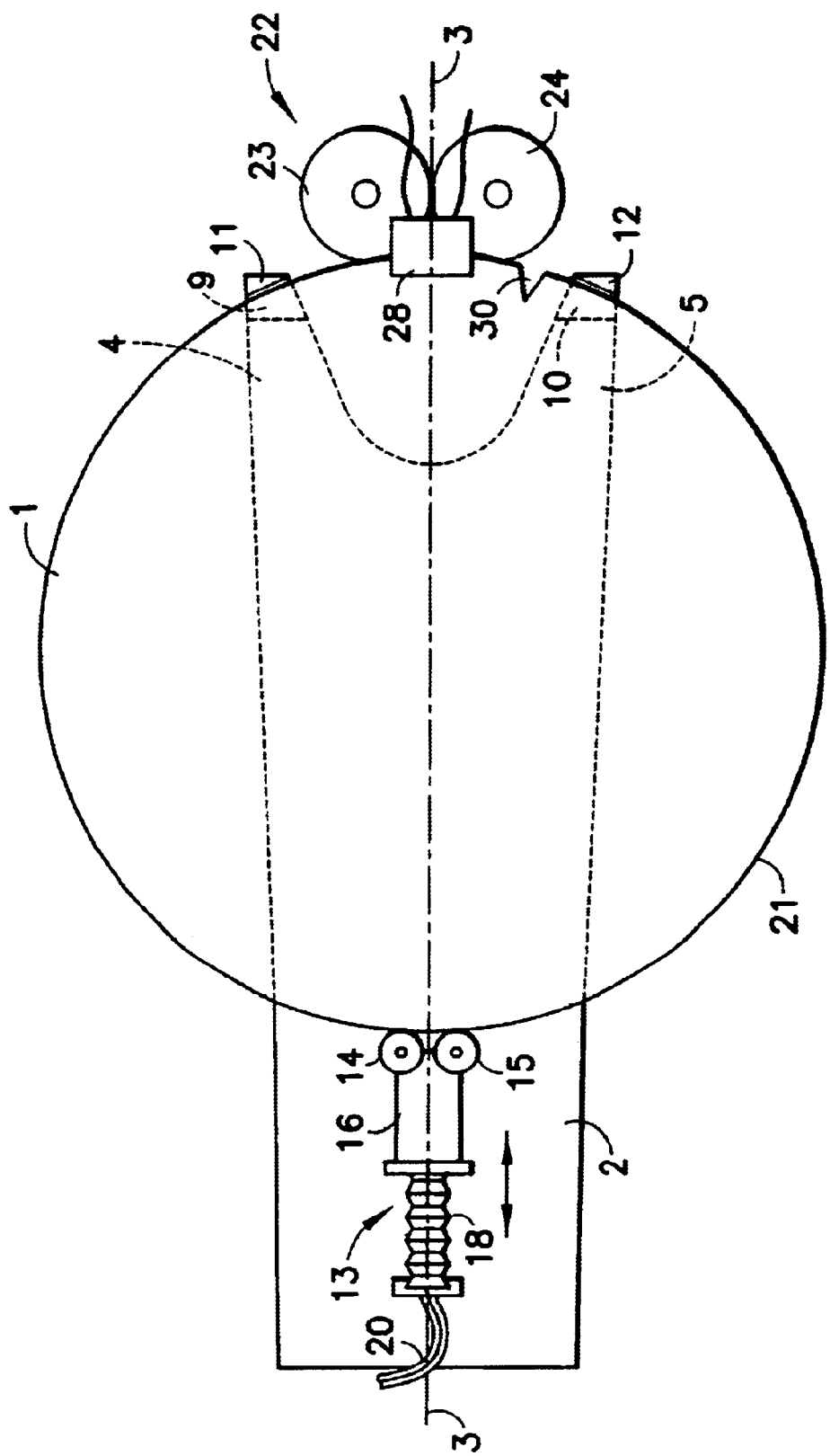
FIG. 1 is a top view of a substrate alignment/orientation mechanism according to this invention.
Figure 2:
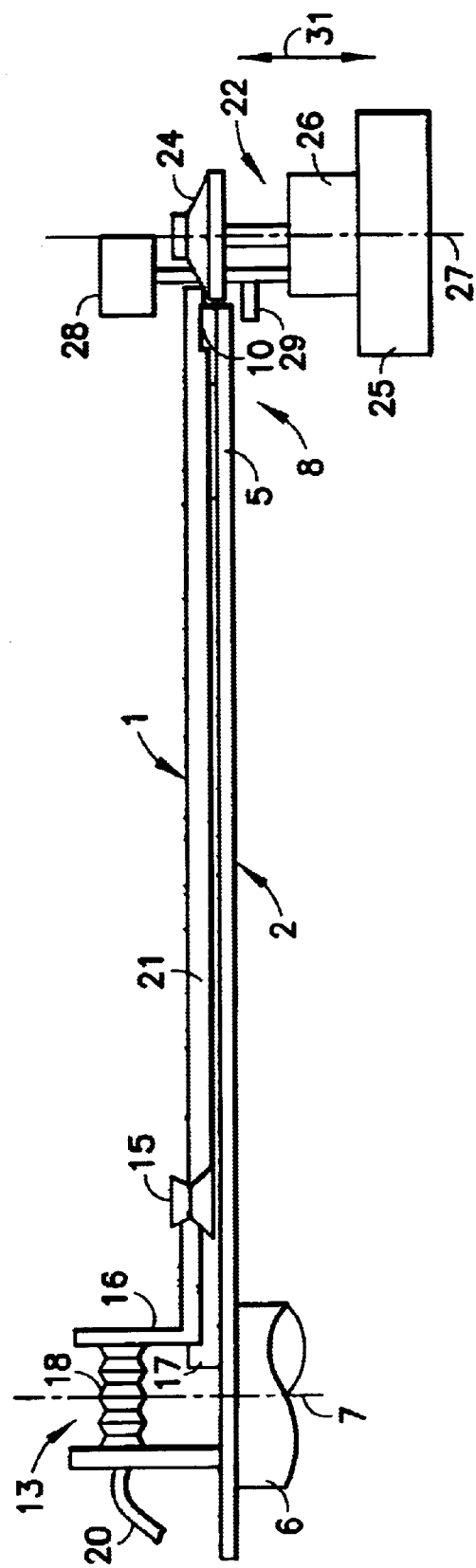
FIG. 2 is a side view of the mechanism of FIG. 1.
Figure 3:
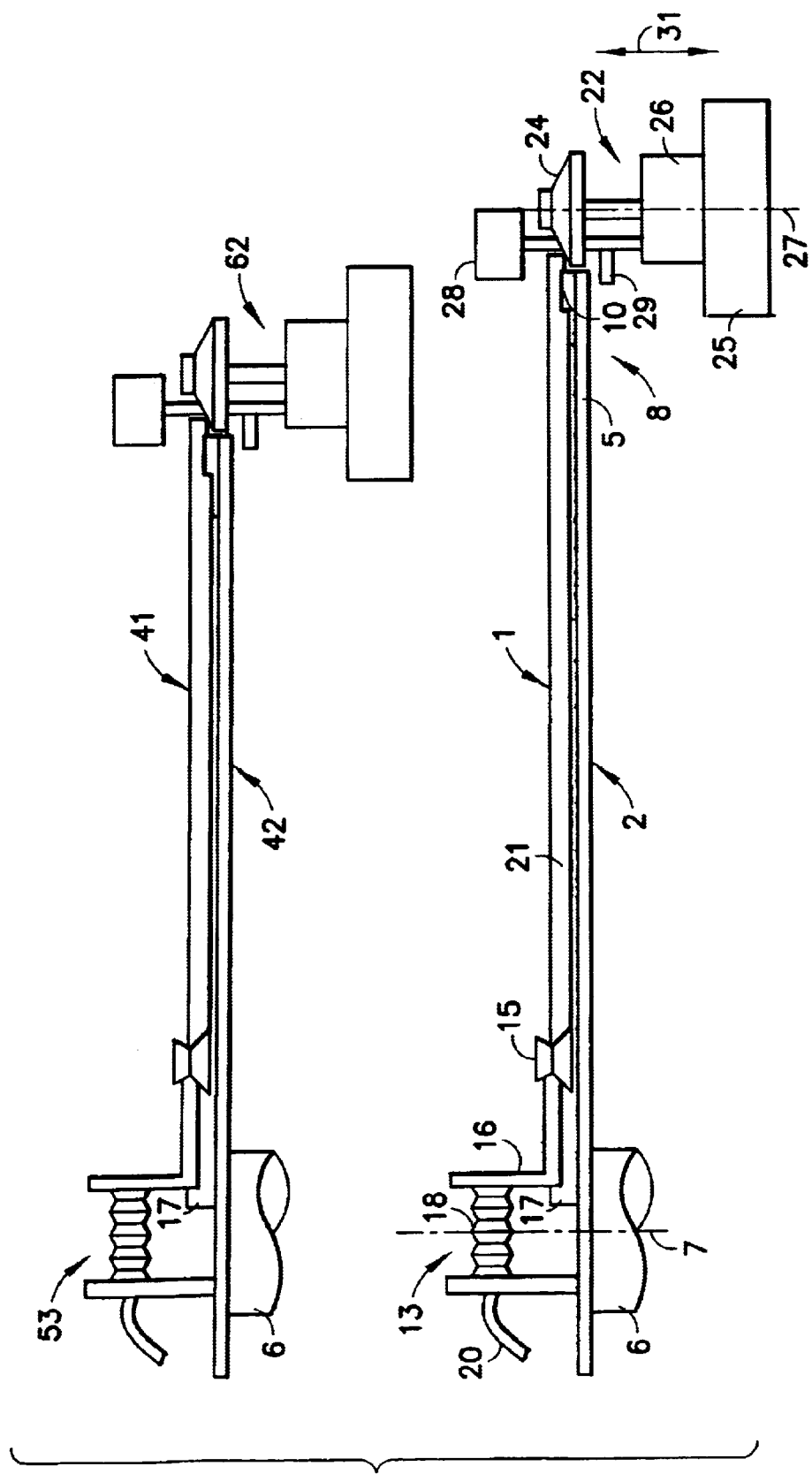
FIG. 3 is a side view of a robot system showing an alternate embodiment of this invention in which two substrates are oriented.

The registration system of this invention is shown in FIGS. 1 and 2 for use with robot system as shown in FIG. 3. A substrate 1 is positioned on an effector 2 in alignment with the central longitudinal axis 3 of the effector 2. Effector 2 is connected for movement on the robot 6 about an axis 7 and extends outward to a distal end 8. Distal end 8 is typically configured having a pair of projections 4 and 5 which extend equidistant to either side of axis 3. Positioning pads 9 and 10 are fixed to the outer ends of each of the projections 4 and 5. Pads 9 and 10 are constructed with steps 11 and 12 which receive the edge 21 of substrate 1. The banking surfaces of steps 11 and 12 are flat. Steps 11 and 12 are positioned to provide accurate registration surfaces against which the substrate 1 can be banked.

The substrate 1 may be placed on the effector 2 by a load transport or by other means well known in the art. A positioning actuator 13 is mounted at the back end of the effector 2, to accurately position the substrate 1 against the steps 11 and 12 after it is acquired. Actuator 13 comprises a pair of idler rollers 14 and 15 which are mounted on a bracket 16. Bracket 16 is mounted for sliding motion on effector 2 on, for example, rail 17. Movement of the bracket 16 is provided by a vacuum actuator consisting of a bellows 18 mounted on a bracket 19 secured at the back end of effector 2, as shown in FIG. 2. Bellows 18 is connected by a flexible conduit 20 to a vacuum pump. The bellows 18 is designed with a spring constant which tends to move the idler rollers 14 and 15 against the edge 21 of substrate 1. This movement is sufficient to engage the substrate 1 and push edge 21 against the steps 11 and 12 of the positioning pads 9 and 10. This accurately positions the substrate 1 along the central axis 3 of effector 2. The idler rollers 14 and 15 can be retracted by operation of the vacuum pump.

In order to adjust the angular orientation of the substrate 1 and complete the registration process, an orientation module 22 is positioned adjacent to the robot in a position in which the substrate edge 21 can be engaged through appropriate movement of the effector 2 at a convenient point in its trajectory. As shown in FIGS. 1 and 2, the orientation module 22 consists of a pair of wheels 23 and 24 positioned adjacent to each other at edge 21 and mounted on a platform 25. One of the wheels, wheel 23 for example as shown in FIG. 2, is driven by motor 26 on platform 25 about an axis 27. An optical sensor 28 is also mounted on platform 25 between wheels 23 and 24 to sense the edge 21. Optical sensor 28 may comprise a simple optical fiber light source which transmits light to a receptor 29 fixed to platform 25 underneath edge 21. In this configuration the edge 21 would prevent transmitted light from reaching receptor 29 except when an orientation notch 30, formed in edge 21, is in the sensor target area. Transmitted light impinging on receptor 29 will generate a signal in the sensor which indicates the position of the notch. At this point the wheel 23 is rotated to position the substrate 1 at its predetermined angular position.

It may be necessary, in order to allow the rotation of the substrate 1, to lift the edge of substrate 1 to clear the positioning pads 9 and 10. This can be accomplished by providing a z axis motion, as shown by arrow 31 in FIG. 2. This motion could be accomplished by dropping the effector on the z axis of the robot or by providing a lift motion for the platform 25.

As shown in FIGS. 1 and 2 the orientation module 22 is position off the robot in a position adjacent the normal trajectory of the substrate in its motion cycle. In the alternate embodiment shown in FIG. 3, the orientation module 22 is mounted on a lower link arm of the robot 6. In this instance a z component of motion is provided for the module 22 in order to lift the substrate free of positioning pads 9 and 10. To move the effector into a position in which edge 21 engages wheels 23 and 24, the effector must have unlimited rotation on the robot.

In operation substrate 1 is placed on effector 2 and moved to its centered position against steps 11 and 12 by the action of vacuum bellows 18. Effector 2 is then moved into a position in which edge 21 is in frictional engagement with wheels 23 and 24. The engagement occurs under the edge 21. At this point unless, the ramp action of the engagement of wheels 23 and 24 is sufficient, the robot is energized to drop a slight amount in the z direction or the orientation module may raised slightly to lift the edge 21 off of position pads 9 and 10. Optical sensor 28 is monitored to detect the position of the orientation notch 30. This step requires energizing motor 26 to drive wheel 24. Through the engagement between edge 21 and wheel 24, the substrate will be rotated until the notch enters the target area of the sensor 28. An accurate position of the notch is calculated by sensing both sides of the notch. This information is used as the null point of orientation. The motor is then energized to rotate the substrate to a predetermined angular orientation according to the substrate specifications.

In this manner a simple and convenient registration mechanism is provided which allows accurate alignment of the substrate on the effector oriented to the desired angle. This is accomplished without adding appreciable mass to the effector and within the normal processing cycle path of the substrate.

An alternate embodiment is shown in FIG. 3. In this system dual end effectors 2 and 42 are mounted to support two substrates 1 and 41 for independent movement. Each of the end effectors 2 and 42 are constructed as described above having matching edge alignment assemblies 13 and 53. A pair of orientation modules 22 and 62 are mounted in a position convenient to the trajectory of a respective end effector, each of which operate as described above. As shown, one trajectory has a lower operational plane than the other. Two substrates would be picked up at same time and moved into engagement with their respective orientation modules, which operate on dual levels. Alignment is done in parallel, namely, both end effectors will lower at the same rate, both substrate notch sensors will be monitored independently, and both actuators will actuate independently in accordance with their sensed orientation. Depending on the trajectories of the effectors, it may be convenient to use one orientation module with one effector rotating out of the way to allow orientation of the second substrate.

I claim:

1. Apparatus for aligning a substrate on a robot arm and orienting the angular position of the substrate on the robot arm comprising:
    an effector for supporting said substrate, mounted on said robot arm, said effector extending longitudinally from a back end to a distal end;
    at least a pair of positioning pads fixed on the distal end to provide an accurate position reference for the substrate;
    a bracket having means for engaging said substrate to allow rotation of the substrate on the effector about an axis transverse to the effector, said bracket mounted to the effector for sliding motion along a central longitudinal axis of the effector;
    an actuator fixed to the effector and to said bracket to cause sliding movement of the engaging means along said longitudinal axis to position the substrate accurately on said positioning pads;
    an orientation module positioned adjacent to the distal end of the effector to allow engagement of the substrate edge, said module comprising:
        at least a pair of wheels one of which being rotatably driven about an axis transverse to the substrate, said wheels positioned to engage the substrate;
        a sensor for sensing the edge of the substrate and operating to locate an orientation notch on the edge of the substrate; and
        wherein rotation of the drive wheel rotates the substrate to allow said sensor to sense the notch and then to move the substrate to a predetermined angular position on the effector.

2. Apparatus for aligning a substrate on a robot arm and orienting the angular position of the substrate on the robot arm, according to claim 1, wherein said means for engaging said substrate comprises at least a pair of idler rollers mounted on said bracket.

3. Apparatus for aligning a substrate on a robot arm and orienting the angular position of the substrate on the robot arm, according to claim 1, wherein said sensor is an optical sensor.

4. Apparatus for aligning a substrate on a robot arm and orienting the angular position of the substrate on the robot arm, according to claim 1 wherein the orientation module is mounted independent of the robot.

5. Apparatus for aligning a substrate on a robot arm and orienting the angular position of the substrate on the robot arm, according to claim 1 wherein the orientation module is mounted on a link of the robot below said effector.

6. Apparatus for aligning a substrate on a robot arm and orienting the angular position of the substrate on the robot arm, according to claim 5, further comprising a z axis drive motor operatively associated with the orientation module for causing movement of said orientation module in a direction transverse to the substrate, wherein said orientation module lifts the substrate from engagement with the positioning pads.

7. Apparatus for aligning a substrate on a robot arm and orienting the angular position of the substrate on the robot arm, according to claim 5, wherein said effector is mounted on the robot for unlimited rotation to enable the effector move the substrate into engagement with the wheels of the orientation module.

8. Apparatus for aligning a substrate on a robot arm and orienting the angular position of the substrate on the robot arm, according to claim 1, wherein said actuator comprises a vacuum bellows operatively connected to the bracket of the idler rollers.

9. Apparatus for aligning a substrate on a robot arm and orienting the angular position of the substrate on the robot arm, according to claim 1, wherein the positioning pads further comprise a raised step constructed on the positioning pads to accurately locate the substrate on the effector, and wherein said actuator pushes the substrate outward into engagement with the step.

10. Apparatus for aligning a substrate on a robot arm and orienting the angular position of the substrate on the robot arm, according to claim 1, further comprising:
    a second effector for supporting a second substrate, mounted on a second robot arm, said effector extending longitudinally from a back end to a distal end;
    a second pair of positioning pads fixed on the distal end to provide an accurate position reference for the second substrate;
    a second bracket having means for engaging said second substrate to allow rotation of the second substrate on the second effector about an axis transverse to the second effector, said second bracket mounted to the second effector for sliding motion along a central longitudinal axis of the second effector;
    a second actuator fixed to the second effector and to said second bracket to cause sliding movement of the engaging means along said longitudinal axis to positioning the second substrate accurately on said position pads;
    a second orientation module positioned adjacent to the distal end of the second effector to allow engagement of the second substrate edge, said second module comprising:
        at least a pair of wheels one of which being rotatably driven about an axis transverse to the second substrate, said wheels positioned to engage the second substrate;
        a sensor for sensing the edge of the second substrate and operating to locate an orientation notch on the edge of the second substrate; and
        wherein rotation of the drive wheel rotates the second substrate to allow said sensor to sense the notch and then to move the second substrate to a predetermined angular position on the second effector.

* * * * *